(12) United States Patent
Yamakami et al.

(10) Patent No.: US 10,403,795 B2
(45) Date of Patent: Sep. 3, 2019

(54) LIGHT-EMITTING DEVICE

(71) Applicant: NICHIA CORPORATION, Anan-shi, Tokushima (JP)

(72) Inventors: Yuya Yamakami, Komatsushima (JP); Daisuke Morita, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/918,776

(22) Filed: Mar. 12, 2018

(65) Prior Publication Data

US 2018/0204981 A1    Jul. 19, 2018

Related U.S. Application Data

(62) Division of application No. 15/462,362, filed on Mar. 17, 2017, now Pat. No. 9,947,832.

(30) Foreign Application Priority Data

Mar. 22, 2016 (JP) ................. 2016-056443

(51) Int. Cl.
*H01L 27/15* (2006.01)
*H01L 33/22* (2010.01)
(Continued)

(52) U.S. Cl.
CPC .............. *H01L 33/38* (2013.01); *H01L 27/15* (2013.01); *H01L 33/22* (2013.01); *H01L 33/405* (2013.01);
(Continued)

(58) Field of Classification Search
CPC ......... H01L 33/38; H01L 33/44; H01L 33/22; H01L 33/32; H01L 33/62
See application file for complete search history.

(56) References Cited

U.S. PATENT DOCUMENTS 9,236,533 B2   1/2016 Im et al.
2003/0141506 A1   7/2003 Sano et al.
(Continued)

FOREIGN PATENT DOCUMENTS

JP   2006-351596 A   12/2006
JP   2010-272724 A   12/2010
(Continued)

OTHER PUBLICATIONS

Notice of Allowance for U.S. Appl. No. 15/462,362 dated Jan. 4, 2018.

*Primary Examiner* — Galina G Yushina
(74) *Attorney, Agent, or Firm* — Foley & Lardner LLP

(57) ABSTRACT

A light-emitting device includes a semiconductor layered structure; an upper electrode disposed on a portion of an upper surface of the semiconductor layered structure; a lower electrode disposed on a lower surface of the semiconductor layered structure in a region spaced from a region directly under the upper electrode, the lower electrode being reflective; and a protective film disposed continuously on a surface of the upper electrode and the upper surface of the semiconductor layered structure. A thickness of a first portion of the protective film, which is disposed at least in a region directly above the lower electrode, is smaller than a thickness of a second portion of the protective film, which is disposed continuously on the surface of the upper electrode and the upper surface of the semiconductor layered structure adjacent to the portion on which the upper electrode is disposed.

19 Claims, 3 Drawing Sheets

(51) Int. Cl.
*H01L 33/32* (2010.01)
*H01L 33/38* (2010.01)
*H01L 33/44* (2010.01)
*H01L 33/62* (2010.01)
*H01L 33/40* (2010.01)

(52) U.S. Cl.
CPC .............. *H01L 33/44* (2013.01); *H01L 33/62* (2013.01); *H01L 33/32* (2013.01)

(56) References Cited

U.S. PATENT DOCUMENTS

| | | |
|---|---|---|
| 2006/0202219 A1 | 9/2006 | Ohashi et al. |
| 2006/0278864 A1 | 12/2006 | Nagai et al. |
| 2007/0097485 A1* | 5/2007 | Yang ................... G02B 26/0841 359/290 |
| 2009/0179215 A1* | 7/2009 | Matsui .................... H01L 33/40 257/98 |
| 2010/0072501 A1* | 3/2010 | Wakai .................... H01L 33/20 257/98 |
| 2011/0089452 A1 | 4/2011 | Jeong et al. |
| 2011/0156070 A1* | 6/2011 | Yoon ..................... H01L 33/385 257/98 |
| 2011/0220928 A1 | 9/2011 | Muramoto |
| 2011/0253972 A1 | 10/2011 | Xiong et al. |
| 2011/0291133 A1 | 12/2011 | Tanaka et al. |
| 2012/0049238 A1* | 3/2012 | Tanaka .................... H01L 33/38 257/99 |
| 2012/0080689 A1 | 4/2012 | Nabekura et al. |
| 2014/0367722 A1 | 12/2014 | Im et al. |
| 2015/0076550 A1* | 3/2015 | Tanaka .................... H01L 33/62 257/99 |
| 2015/0155442 A1 | 6/2015 | Chien et al. |
| 2015/0228862 A1 | 8/2015 | Miyoshi et al. |
| 2015/0349220 A1 | 12/2015 | Moon et al. |
| 2017/0108937 A1* | 4/2017 | Kim ..................... G06F 3/0202 |

FOREIGN PATENT DOCUMENTS

| | | |
|---|---|---|
| JP | 2011-086909 A | 4/2011 |
| JP | 2011-192675 A | 9/2011 |
| JP | 2011-192708 A | 9/2011 |
| JP | 2011-198992 A | 10/2011 |
| JP | 2011-249510 A | 12/2011 |
| JP | 2012-142508 A | 7/2012 |
| JP | 2014-060294 A | 4/2014 |
| JP | 2014-170815 A | 9/2014 |
| JP | 2014-236070 A | 12/2014 |

* cited by examiner

LIGHT-EMITTING DEVICE

CROSS-REFERENCE TO RELATED APPLICATION

The present application is a divisional of U.S. patent application Ser. No. 15/462,362, filed on Mar. 17, 2017, which claims priority to Japanese Patent Application No. 2016-056443, filed on Mar. 22, 2016, the disclosures of which are hereby incorporated by reference in their entireties.

BACKGROUND

The present disclosure relates to a light-emitting device.

Japanese Laid-Open Patent Publication No. 2014-236070 discloses a light-emitting device in which a bonding electrode is disposed on an upper surface side of a semiconductor layered structure, a metal electrode is disposed on a lower surface side of the semiconductor layered structure, and a protective film is disposed on a surface of the semiconductor layered structure.

SUMMARY

In the above-described light-emitting device, a protective film with a uniform thickness is disposed on an upper surface of the semiconductor layered structure. With this arrangement, in the case where the protective film has a small thickness, the semiconductor layered structure may be deteriorated. If the thickness of the protective film is increased, deterioration of the semiconductor layered structure can be suppressed but, on the other hand, light from the semiconductor layered structure is easily absorbed by the protective film, so that the light extraction efficiency may be decreased. In view of this, one of the objects of the present disclosure is to provide a light-emitting device in which deterioration of the semiconductor layered structure is reduced and which has a high light extraction efficiency.

A light-emitting device according to one embodiment of the present disclosure includes: a semiconductor layered structure; an upper electrode disposed on a portion of an upper surface of the semiconductor layered structure; a lower electrode having light reflectivity and disposed on a lower surface of the semiconductor layered structure in a region a region of spaced from a region directly under the upper electrode; and a protective film disposed to be continuous on a surface of the upper electrode and on the upper surface of the semiconductor layered structure. A portion of the protective film in a region directly above the lower electrode has a thickness smaller than a thickness of a portion of the protective film that is continuous on the surface of the upper electrode and on the upper surface of the semiconductor layered structure in a region in the vicinity of a region in which the upper electrode is disposed.

The above-described configuration can realize a light-emitting device in which deterioration of the semiconductor layered structure is reduced and which has a high light extraction efficiency.

DETAILED DESCRIPTION OF EMBODIMENTS

First Embodiment

Figure 1:
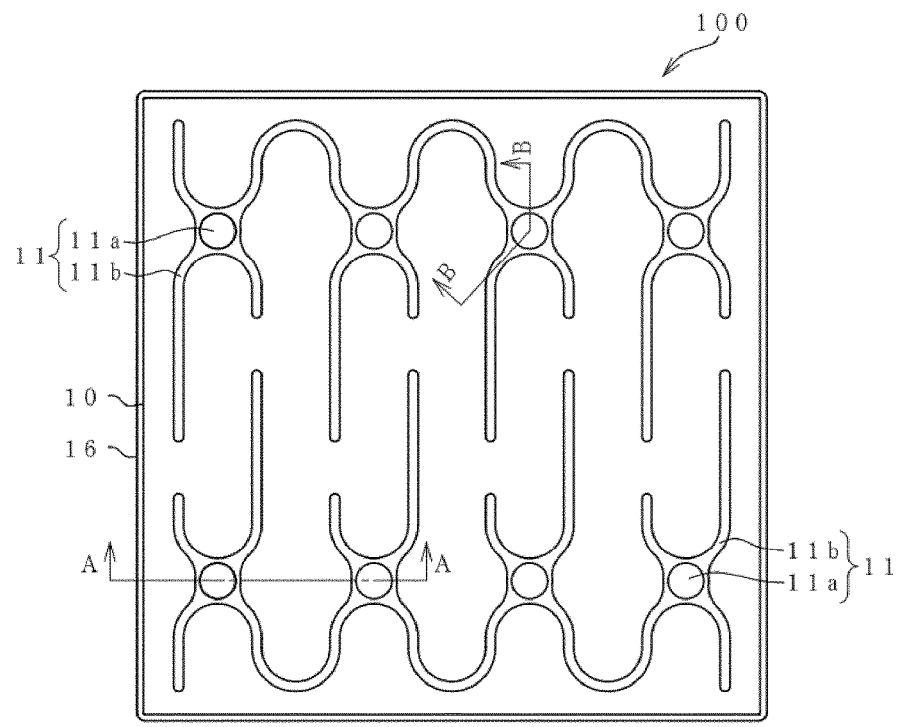
FIG. 1 is a top view schematically showing the configuration of a light-emitting device according to a first embodiment.
Figure 2:
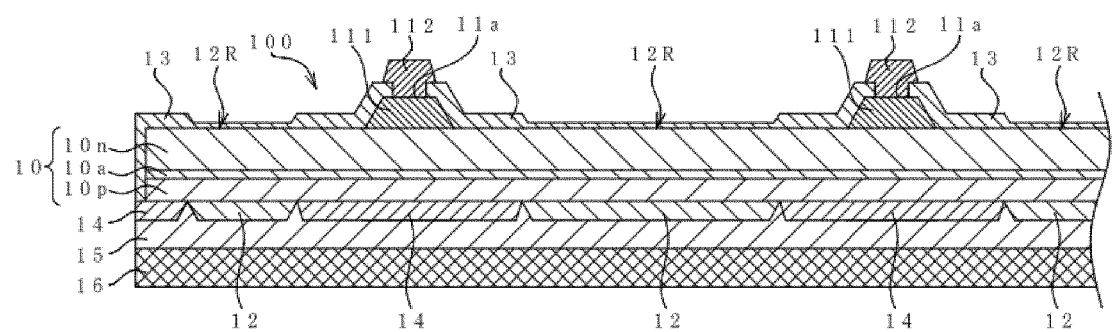
FIG. 2 is a partial cross-sectional view taken along line A-A of FIG. 1, schematically showing the configuration of the light-emitting device according to the first embodiment.
Figure 3:
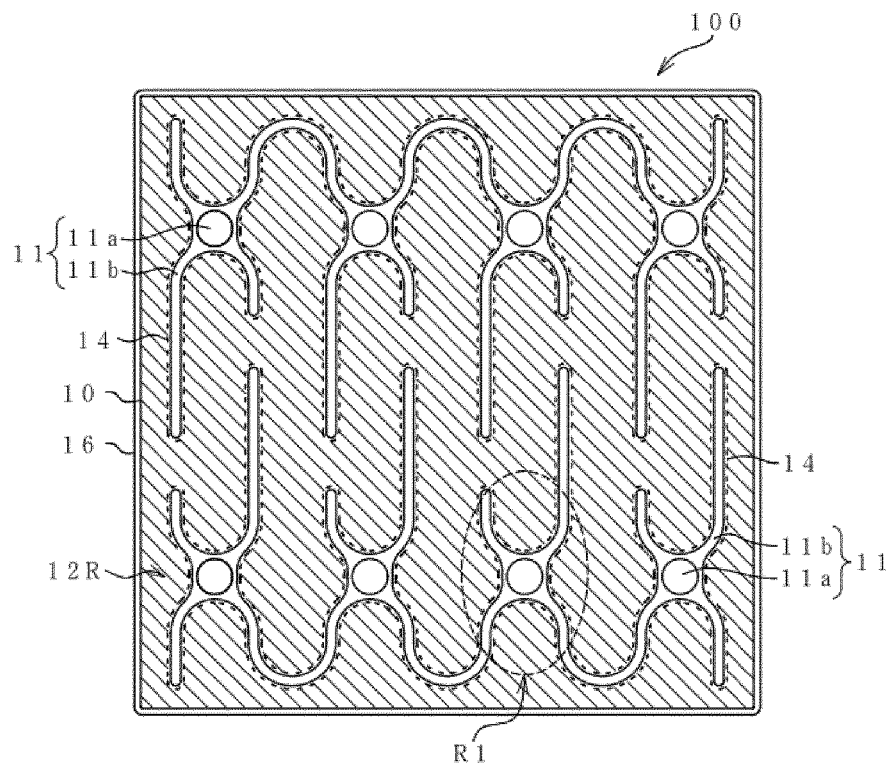
FIG. 3 is a top view schematically showing the configuration of the light-emitting device according to the first embodiment.
Figure 4:
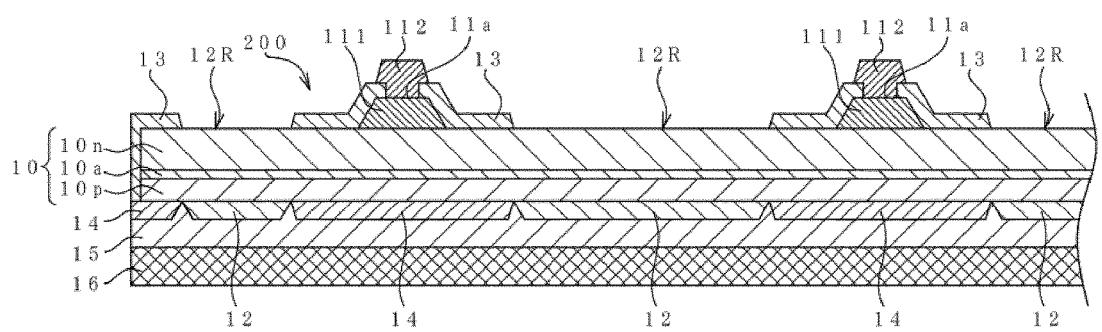
FIG. 4 is a partial cross-sectional view taken along line A-A of FIG. 1, schematically showing the configuration of a light-emitting device according to a second embodiment.
Figure 5:
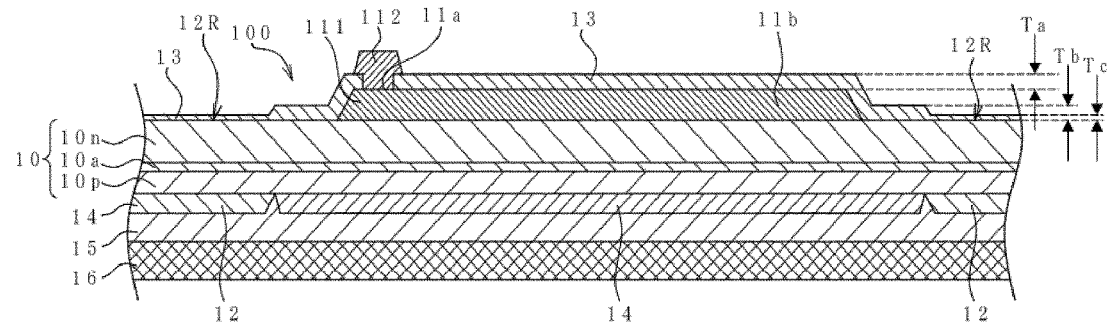
FIG. 5 is a partial cross-sectional view taken along line B-B of FIG. 1, schematically showing the configuration of the light-emitting device according to the first embodiment.
Figure 6:
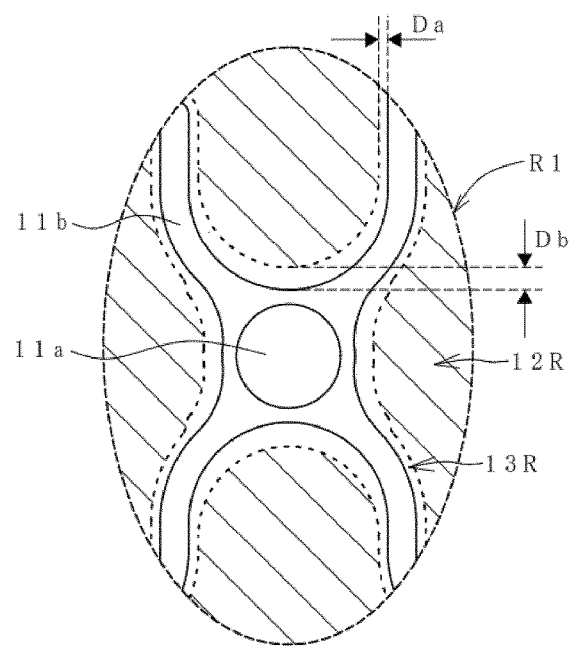
FIG. 6 is an enlarged top view of a region indicated by R1 in FIG. 3, schematically showing the configuration of the light-emitting device according to the first embodiment.

FIG. 1 is a top view of a light-emitting device 100 according to the present embodiment. FIG. 2 is a schematic partial cross-sectional view for illustrating the configuration of the light-emitting device 100. FIG. 3 is a schematic top view for illustrating a region of the light-emitting device 100 in which members disposed on the upper and lower surfaces of a semiconductor layered structure 10 are disposed. FIG. 4 is a partial cross-sectional view for illustrating the configuration of a light-emitting device 200 according to a second embodiment. FIG. 5 is a partial cross-sectional view for illustrating the configuration of a light-emitting device 100 according to the first embodiment. FIG. 6 is an enlarged top view of a region indicated by R1 in FIG. 3, schematically showing the configuration of the light-emitting device 100 according to the first embodiment. In FIG. 3 the hatched region indicates a region in which a lower electrode 12 is disposed in a top view, and does not indicate a cross section.

The light-emitting device 100 includes a semiconductor layered structure 10, an upper electrode 11 disposed on a portion of the upper surface of the semiconductor layered structure 10, a lower electrode 12 having light reflectivity and disposed on the lower surface of the semiconductor layered structure 10 in a region spaced from a region directly under the upper electrode 11, and a protective film 13 disposed to be continuous on a surface of the upper electrode 11 and on the upper surface of the semiconductor layered structure 10. A portion of the protective film 13 in a region 12R directly above the lower electrode 12 has a thickness smaller than a thickness of a portion of the protective film 13 disposed continuously on the surface of the upper electrode 11 and on a portion of the upper surface of the semiconductor layered structure 10 in the vicinity of a region in which the upper electrode 11 is disposed.

With this arrangement, deterioration of the semiconductor layered structure can be reduced and light extraction efficiency can be improved. This is illustrated in the description below.

In the light-emitting device 100, the upper surface of the semiconductor layered structure 10 serves as a surface from which light is primarily extracted. Surfaces of the semiconductor layered structure 10 are covered with a transparent protective film 13 for reducing deterioration of the semiconductor layered structure 10. However, a portion of light from the semiconductor layered structure 10 is absorbed by the protective film 13, so that the output can be decreased. In particular, in the light-emitting device 100, the upper electrode 11 and the lower electrode 12 are disposed in different regions in a top view. Therefore, when viewed from the top surface, the region directly above the lower electrode 12 tends to emit intense light. Thus, in the region directly above the lower electrode 12, a portion of the light is easily absorbed by the protective film. Meanwhile, moisture may enter through an opening defined in the protective film 13, through which the power is to be supplied from an external device, and a portion of the protective film 13 having a small thickness. Further, at the upper surface of the semiconductor layered structure 10, current density in regions in the vicinity of the regions in which the upper electrodes 11 are disposed (hereinafter, may be referred to as "vicinity regions 13R") is higher than the other region, and accordingly optical density in this region is increased. Due to moisture and high optical density as described above, portions of the semiconductor layered structure 10 in the vicinity regions 13R may be easily oxidized and deteriorated.

In view of the above, in the present embodiment, the thickness of a portion of the protective film 13 on the upper surface of the semiconductor layered structure 10 in the region 12R directly above the lower electrode 12 is reduced, which allows for reducing absorption of light by the protective film 13, so that the light extraction efficiency is improved. Meanwhile, the thickness of a portion of the protective film 13 on the surface of the upper electrode 11 and in the vicinity regions 13R is increased. With this configuration, in the vicinity regions 13R, where the semiconductor layered structure 10 tends to be easily deteriorated, deterioration of the semiconductor layered structure 10 can be reduced. That is, in the present embodiment, the light extraction efficiency can be improved while the reliability of the light-emitting device 100 is maintained.

In the description below, the configuration of the light-emitting device 100 is described with reference to the drawings.

The semiconductor layered structure 10 includes a p-side semiconductor layer 10p, an active layer 10a and a n-side semiconductor layer 10n in this order from the substrate 16 side, which is the lower side of the light-emitting device 100, as shown in FIG. 2. In a top view, the semiconductor layered structure 10 has a generally square shape with each side of about 2 mm. For each of the n-side semiconductor layer 10n, the active layer 10a and the p-side semiconductor layer 10p, a nitride semiconductor such as, for example, $In_XAl_YGa_{1-X-Y}N$ ($0 \leq X$, $0 \leq Y$, $X+Y<1$) can be used.

The upper surface of the n-side semiconductor layer 10n of the semiconductor layered structure 10 can be a roughened surface. With the upper surface that is roughened, the light extraction efficiency can be improved. For example, when upper surface of the n-side semiconductor layer 10n is roughened by forming a plurality of protrusions, each of the protrusions preferably has a height of 0.2 to 3.0 μm, more preferably has a height of 0.4 to 1.5 μm, for appropriately improving the light extraction efficiency.

The upper electrodes 11 are disposed on portions of the upper surface of the semiconductor layered structure 10 and are electrically connected with the n-side semiconductor layer 10n as shown in FIG. 2. That is, in the present embodiment, the upper electrodes 11 function as the n-electrode.

The upper electrodes 11 each includes an external connecting portion 11a and an extended portion 11b extending from the external connecting portion 11a. The external connecting portion 11a is a region to be connected with an external member, such as a wire. The extended portion 11b is an electrode for diffusing an electric current supplied to the external connecting portion 11a over a larger area. As shown in FIG. 1, a plurality of external connecting portions 11a are disposed on the upper surface of the semiconductor layered structure 10, the extended portion 11b is disposed at each of the external connecting portions 11a. For the upper electrodes 11, a metal such as Ni, Au, W, Pt, Al, Rh, Ti, or the like, can be used.

The lower electrode 12 is disposed on a portion of the lower surface of the semiconductor layered structure 10 and is electrically connected with the p-side semiconductor layer 10p. That is, in the present embodiment, the lower electrode 12 functions as the p-electrode. In FIG. 3, the lower electrode 12 is disposed in a region hatched with oblique lines sloping upward to the left. As can be understood from FIG. 3, the lower electrode 12 is disposed on the lower surface of the semiconductor layered structure 10 in a region which is spaced from a region directly under the upper electrodes 11. With this arrangement, current can be easily flown into portions of the semiconductor layered structure 10 in the region other than the regions directly under the upper electrodes 11, so that the current is diffused over a larger area in the semiconductor layered structure 10. Accordingly, the emission region of the light-emitting device 100 can be increased.

The lower electrode 12 is configured to reflect light from the semiconductor layered structure 10 toward the upper surface side, which allows for improving the light extraction efficiency of the light-emitting device 100. For this reason, the lower electrode 12 is preferably made of a metal which has a high reflectance. For example, a metal such as Ag, Al, or an alloy whose main component is one or more of these metals can be used.

The protective film 13 has the function of protecting the light-emitting device 100. The protective film 13 is disposed on a portion of the upper surface of the semiconductor layered structure 10 on which the upper electrodes 11 are not disposed, and on a surface of each of the upper electrodes 11. To secure connection with external members, the protective film 13 is not disposed on a portion of each external connecting portion 11a. At this region, an electrically-conductive wire, or the like, is bonded for electrical connection with an external power supply.

A portion of the protective film 13 in the region 12R directly above the lower electrode 12 has a thickness smaller than a thickness of a portion of the protective film 13 continuous on the surface of each of the upper electrodes 11 and on the upper surface of the semiconductor layered structure 10 in the vicinity regions 13R. In other words, the portion of the protective film 13 disposed continuously on the surface of each of the upper electrodes 11 and the upper surface of the semiconductor layered structure 10 in the vicinity regions 13R has a thickness (for example, Ta and Tb shown in FIG. 5) greater than the thickness (for example, Tc shown in FIG. 5) of a portion of the protective film 13 in the region 12R directly above the lower electrode 12. With this arrangement, deterioration of the semiconductor layered structure 10 can be reduced, and light from the semiconductor layered structure 10 can be efficiently extracted. Note that the "thickness" of the protective film 13 used in the present specification refers to a dimension of the protective film in a direction perpendicular to a surface of each member on which the protective film 13 is to be formed.

In the light-emitting device 100, a thickness of the protective film 13 is reduced only in the region directly above the lower electrode 12. That is, in the other regions, the protective film 13 has a relatively large thickness. With this arrangement, the light extraction efficiency can be further improved.

The protective film 13 has a relatively large thickness at the periphery of the semiconductor layered structure 10 as shown in FIG. 2. A portion of the protective film 13 at the periphery of the semiconductor layered structure 10, particularly a portion of the protective film 13 over the upper and lateral surfaces of the semiconductor layered structure 10, is likely to have a smaller thickness. In view of this, forming protective film 13 to have a relatively large thickness at the periphery of the semiconductor layered structure 10 allows for protecting the semiconductor layered structure 10, so that reliability can be further improved.

A portion of the protective film 13 in the region 12R directly above the lower electrode 12 preferably has a thickness of 40% or less, more preferably 35% or less, of the thickness of a portion of the protective film 13 on the surface of each of the upper electrodes 11 and on the upper surface of the semiconductor layered structure 10 in the vicinity regions 13R. For example, it is preferable that the thickness of a portion of the protective film 13 in the region directly above the lower electrode 12 is 0.2 µm, while the thickness of a portion of the protective film 13 continuous on the surface of each of the upper electrode 11 and the upper surface of the semiconductor layered structure 10 in the vicinity regions 13R is 0.7 µm. With this arrangement, deterioration of the semiconductor layered structure 10 in the vicinity regions 13R of the upper electrodes 11 can be reduced, which allows for maintain reliability, and light from the semiconductor layered structure 10 can be efficiently extracted.

A portion of the protective film 13 in the region 12R directly above the lower electrode 12 preferably has a thickness of 0.2 to 0.3 µm. With this arrangement, absorption of light from the semiconductor layered structure 10 can be further reduced while the protective film 13 has the protection function to some extent. A portion of the protective film 13 continuous on the surface of each of the upper electrode 11 and the upper surface of the semiconductor layered structure 10 in the vicinity regions 13R preferably has a thickness of 0.5 to 1.0 µm. With this arrangement, moisture does not easily pass through the protective film 13 and reach the semiconductor layered structure 10. Therefore, deterioration of the semiconductor layered structure 10 can be reduced. Further, the semiconductor layered structure 10 can be protected from external shocks and the like, so that the reliability of the light-emitting device 100 can be improved.

The protective film 13 is disposed to be continuous on a surface of the extended portion 11b and on the upper surface of the semiconductor layered structure 10 including a region in the vicinity of a region on which the extended portion 11b is disposed. Here, a portion of the protective film 13 on a surface of the extended portion 11b and a portion of the upper surface of the semiconductor layered structure 10 in the region in the vicinity of the region on which the extended portion 11b is disposed has a thickness greater than the thickness of a portion of the protective film 13 in the region 12R directly above the lower electrode 12 as shown in FIG. 5. With this arrangement, the effects of the protective film 13 can be obtained over a wide area of the upper surface of the semiconductor layered structure 10, so that the reliability and the light extraction efficiency can be further improved.

As shown in FIG. 2, each of the upper electrode 11 preferably includes a first upper electrode 111 disposed on a portion of the upper surface of the semiconductor layered structure 10 and a second upper electrode 112 disposed on the first upper electrode 111. In the case where the upper electrodes 11 each has such a multilayer structure, an end portion of the protective film 13 is preferably disposed between the first upper electrode 111 and the second upper electrode 112. With this arrangement, entry of moisture via the gap between the first upper electrode 111 and the protective film 13 can be reduced, so that deterioration of the semiconductor layered structure 10 can also be reduced, as compared with the case where the second upper electrode 112 is not disposed. In each of the upper electrodes 11, such a multilayer structure may be employed only in a region to be the external connecting portion 11a. With this arrangement, absorption of light by the upper electrodes 11 is reduced, so that reduction in output can be reduced.

At the upper surface of the semiconductor layered structure 10, in a top view, the periphery of each of the vicinity regions 13R in the vicinity of the regions on which the upper electrodes 11 are disposed, is preferably located spaced from an edge of respective one of the upper electrodes 11 by a distance in a range of 15 µm to 30 µm. That is, the periphery of a region of the protective film 13 having a thickness greater than a thickness of a portion of the protective film 13 in the region directly above the lower electrode 12 is preferably positioned in a region spaced from an edge of respective one of the upper electrodes 11 by a distance in a range of 15 µm to 30 µm. With the vicinity regions 13R each having the periphery located spaced from the edge of respective one of the upper electrodes 11 by a distance of 15 µm or more, deterioration of the semiconductor layered structure 10 in the vicinity regions 13R can be suppressed. Further, with the vicinity regions 13R each having the periphery located spaced from the edge of respective one of the upper electrodes 11 by a distance of 30 µm or less, the light extraction efficiency can be improved, and deterioration of the semiconductor layered structure 10 is reduced.

In a region in the vicinity of the region in which the extended portion 11b is disposed, the current density is lower than in a region in the vicinity of the region in which the external connecting portion 11a is disposed, and therefore, deterioration of the semiconductor layered structure 10 does not easily occur. For this reason, as shown in FIG. 6, in a top view, a portion of the protective film 13 having a larger thickness preferably has a length (for example, Da shown in FIG. 6) extending outside of the extended portion 11b that is shorter than a length (for example, Db shown in FIG. 6) thereof extending outside of the external connecting portion 11a. For example, a portion of the protective film 13 having a larger thickness may have a length of 15 µm extending outside of the extended portion 11b, and may have a length of 20 µm extending outside of the external connecting portion 11a. Reliability of the light-emitting device 100 can be maintained even if the area of the protective film 13 having a larger thickness is reduced in the region in the vicinity of the region in which the extended portion 11b is disposed. Accordingly, with this arrangement, absorption of light from the semiconductor layered structure 10 by the protective film 13 can be further reduced, and thus the light extraction efficiency can be improved.

From the viewpoint of insulation, for example, $SiO_2$, SiON and SiN can be used for the protective film 13. In the present embodiment, $SiO_2$ is used for the protective film 13.

The protective film 13 can be formed by sputtering, vapor deposition, or the like. The protective film 13 of the present embodiment which has a varied thickness is formed as below. First, a protective film with a predetermined thickness is disposed on the upper surface of the semiconductor layered structure 10. Then, a mask is disposed on the protective film. The mask has an opening at a portion corresponding to a portion of the protective film to have a smaller thickness. Subsequently, the protective film is etched via the mask, and the mask is removed, so that the protective film 13 with a varied thickness can be formed. Alternatively, first, a protective film of a predetermined thickness is disposed on the upper surface of the semiconductor layered structure 10. Then, a mask is formed on the protective film. The mask has an opening at a portion corresponding to a portion of the protective film to have a greater thickness. Subsequently, another protective film is disposed via the mask. Thereafter, the mask is removed, so the protective film 13 with a varied thickness can be formed. With such formation methods, a protective film 13 which has a desired thickness can be formed.

Insulating members 14 are disposed on the lower surface of the semiconductor layered structure 10 in regions which include regions directly under the upper electrodes 11 as shown in FIG. 2 and FIG. 3. With this arrangement, current is not easily supplied in the regions directly under the upper electrodes 11, so that, in the semiconductor layered structure 10, the region other than the regions directly under the upper electrode 11 serves as a main emission region. Light from regions in the semiconductor layered structure 10 directly under the upper electrodes 11 is easily reflected or absorbed by the upper electrode 11, and thus is difficult to extract from the light-emitting device 100. Therefore, with the semiconductor layered structure 10 in which the region other than the regions directly under the upper electrodes 11 serves as a main emission region, the light extraction efficiency of the light-emitting device 100 can be improved. In the present embodiment, the region in the semiconductor layered structure 10 other than the regions therein directly under the upper electrodes 11, that is, a region in the semiconductor layered structure 10 below which the lower electrode 12 is disposed, serves as a main emission region, and the thickness of a portion of the protective film 13 in the region directly above the lower electrode 12 is reduced. With this arrangement, the light extraction efficiency of the light-emitting device 100 can be improved.

As shown in FIG. 3, in a top view, the insulating members 14 are disposed in regions which include regions directly under the external connecting portions 11a of the upper electrodes 11 and regions directly under the extended portions 11b of the upper electrodes 11. The insulating member 14 is disposed in a region directly under the upper electrode 11, and, in a top view, has an area larger than the total area of the regions in which the upper electrode 11 is disposed. With this arrangement, the region in which the above-described effects of the insulating member 14 are obtained can be increased, so that unevenness in brightness at the light extraction surface of the light-emitting device 100 can be reduced.

In the insulating member 14, the same material as used for the protective film 13 as described above can be used. In the present embodiment, $SiO_2$ is used for the protective film 13.

The insulating member 14 preferably has a thickness of 0.05 μm or greater, more preferably 0.1 μm or greater, for securing insulation. Meanwhile, to reduce the manufacturing cost, the insulating member 14 preferably has a thickness of 1 μm or less, more preferably 0.5 μm or less.

A joining member 15 is disposed between the semiconductor layered structure 10 and the substrate 16, and serves to join these components. In this arrangement, the lower electrode 12, which is disposed on the semiconductor layered structure 10, and the substrate 16 are electrically connected with each other via the joining member 15. The joining member 15 can be formed by disposing electrically-conductive members over substantially the entirety of the lower surface of the semiconductor layered structure 10 and the upper surface of the substrate 16 and joining these electrically-conductive members together. For the joining member 15, a solder material whose main component is, for example, AuSn, NiSn, AgSn, or the like, is preferably used from the viewpoint of bonding performance and electrical conduction.

The substrate 16 is electrically conductive and is disposed below the semiconductor layered structure 10. For the substrate 16, for example, CuW, Si, or Mo can be used.

Second Embodiment

A light-emitting device 200 according to the present embodiment is described with reference to FIG. 4.

The light-emitting device 200 is different from the first embodiment in the structure of the protective film 13. The other configurations are the same as those of the first embodiment.

As shown in FIG. 4, the protective film 13 is not disposed in the region directly above the lower electrode 12. That is, a portion of the upper surface of the semiconductor layered structure 10 in the region directly above the lower electrode 12 is exposed from the protective film 13. With such a configuration, the light extraction efficiency of the light-emitting device can be improved as in the first embodiment. Further, light emission from the semiconductor layered structure 10 in the region on which the protective film 13 is not disposed is not absorbed by the protective film 13, so that the light-emitting device 200 has lower reliability but higher light extraction efficiency than that in the first embodiment.

In the description above, first and second embodiments have been described, but the scope of the present invention is not limited to these embodiments.

While the present invention has been described with respect to exemplary embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A light-emitting device, comprising:
a semiconductor layered structure;
an upper electrode disposed on a portion of an upper surface of the semiconductor layered structure;
a lower electrode disposed on a lower surface of the semiconductor layered structure in a region spaced from a region directly under the upper electrode, the lower electrode being reflective;
a protective film disposed continuously on a surface of the upper electrode and on the upper surface of the semiconductor layered structure; and
an insulating member disposed on the lower surface of the semiconductor layered structure in a region that includes the region directly under the upper electrode;
wherein the protective film is not disposed in a region directly above the lower electrode.

2. The light-emitting device according to claim 1, wherein:
the upper electrode includes:
an external connecting portion configured to be connected with an external device, and
an extended portion extending from the external connecting portion; and the protective film is disposed to be continuous on a surface of the extended portion and on the upper surface of the semiconductor layered structure adjacent to a portion on which the extended portion is disposed.

3. The light-emitting device according to claim 1, wherein:
the upper electrode includes:
a first upper electrode disposed on the portion of the upper surface of the semiconductor layered structure, and
a second upper electrode disposed on the first upper electrode; and
an end portion of the protective film is located between the first upper electrode and the second upper electrode.

4. The light-emitting device according to claim 1, wherein the lower electrode is made of Ag or an alloy whose main component is Ag.

5. The light-emitting device according to claim 1, wherein, in a top view, a periphery of a region of the semiconductor layered structure on which the protective film is disposed is spaced from a periphery of the upper electrode by a distance in a range of 15 µm to 30 µm.

6. The light-emitting device according to claim 2, wherein:
the upper electrode includes:
a first upper electrode disposed on the portion of the upper surface of the semiconductor layered structure, and
a second upper electrode disposed on the first upper electrode; and
an end portion of the protective film is located between the first upper electrode and the second upper electrode.

7. The light-emitting device according to claim 2, wherein the lower electrode is made of Ag or an alloy whose main component is Ag.

8. The light-emitting device according to claim 3, wherein the lower electrode is made of Ag or an alloy whose main component is Ag.

9. The light-emitting device according to claim 6, wherein the lower electrode is made of Ag or an alloy whose main component is Ag.

10. The light-emitting device according to claim 2, wherein, in a top view, a periphery of a region of the semiconductor layered structure on which the protective film is disposed is spaced from a periphery of the upper electrode by a distance in a range of 15 µm to 30 µm.

11. The light-emitting device according to claim 3, wherein, in a top view, a periphery of a region of the semiconductor layered structure on which the protective film is disposed is spaced from a periphery of the upper electrode by a distance in a range of 15 µm to 30 µm.

12. The light-emitting device according to claim 4, wherein, in a top view, a periphery of a region of the semiconductor layered structure on which the protective film is disposed is spaced from a periphery of the upper electrode by a distance in a range of 15 µm to 30 µm.

13. The light-emitting device according to claim 6, wherein, in a top view, a periphery of a region of the semiconductor layered structure on which the protective film is disposed is spaced from a periphery of the upper electrode by a distance in a range of 15 µm to 30 µm.

14. The light-emitting device according to claim 1, wherein the protective film is made of $SiO_2$.

15. The light-emitting device according to claim 2, wherein the protective film is made of $SiO_2$.

16. The light-emitting device according to claim 3, wherein the protective film is made of $SiO_2$.

17. The light-emitting device according to claim 4, wherein the protective film is made of $SiO_2$.

18. The light-emitting device according to claim 5, wherein the protective film is made of $SiO_2$.

19. The light-emitting device according to claim 6, wherein the protective film is made of $SiO_2$.

* * * * *